(12) United States Patent
Ikeda et al.

(10) Patent No.: US 10,944,277 B2
(45) Date of Patent: Mar. 9, 2021

(54) POWER TOOL CHARGING DEVICE AND POWER TOOL CHARGING SYSTEM

(71) Applicant: Panasonic Intellectual Property Management Co., Ltd., Osaka (JP)

(72) Inventors: Masaki Ikeda, Mie (JP); Tatsuya Miwa, Mie (JP); Naoki Tsuruta, Mie (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 56 days.

(21) Appl. No.: 14/633,376

(22) Filed: Feb. 27, 2015

(65) Prior Publication Data
US 2016/0006280 A1 Jan. 7, 2016

(30) Foreign Application Priority Data
Jul. 1, 2014 (JP) .............................. JP2014-136099

(51) Int. Cl.
*H02J 7/00* (2006.01)
*H02J 5/00* (2016.01)
(Continued)

(52) U.S. Cl.
CPC .......... *H02J 7/0042* (2013.01); *G01R 31/382* (2019.01); *H02J 5/00* (2013.01);
(Continued)

(58) Field of Classification Search
CPC ........ H02J 7/0042; H02J 7/355; H02J 7/0027; H02J 7/025; H02J 7/00; H02J 7/0047;
(Continued)

(56) References Cited

U.S. PATENT DOCUMENTS

| 5,736,835 | A | 4/1998 | Nakajo | |
|---|---|---|---|---|
| 7,357,526 | B2* | 4/2008 | Zeiler | B25B 23/18 362/109 |

(Continued)

FOREIGN PATENT DOCUMENTS

| JP | H09-70146 A | | 3/1997 |
|---|---|---|---|
| JP | H10-173802 A | * | 6/1998 |

(Continued)

OTHER PUBLICATIONS

Extended European Search Report dated Nov. 27, 2015 for corresponding European Application No. 15157137.9.
(Continued)

*Primary Examiner* — Drew A Dunn
*Assistant Examiner* — Sailesh Thapa
(74) *Attorney, Agent, or Firm* — Renner, Otto, Boisselle & Sklar, LLP

(57) ABSTRACT

A power tool charging device includes a charging unit that charges a rechargeable battery of a power tool, a condition detection unit that detects condition information of the rechargeable battery, and an information processing unit that receives the condition information of the rechargeable battery from the condition detection unit and outputs the received condition information of the rechargeable battery to a communication unit capable of performing near field communication with another device.

7 Claims, 1 Drawing Sheet

(51) Int. Cl.
*G01R 31/382* (2019.01)
*H02J 7/02* (2016.01)

(52) U.S. Cl.
CPC .............. *H02J 7/00* (2013.01); *H02J 7/0047* (2013.01); *H02J 7/02* (2013.01); *H02J 7/00034* (2020.01)

(58) Field of Classification Search
CPC . H02J 5/00; H02J 7/02; H02J 7/00034; G01R 31/382
USPC ........................................................ 320/107
See application file for complete search history.

(56) References Cited

U.S. PATENT DOCUMENTS

| | | | |
|---|---|---|---|
| 8,476,866 B2 | 7/2013 | Miwa et al. | |
| 8,963,496 B2* | 2/2015 | Yang ................... | H01M 2/1066 320/113 |
| 2001/0010455 A1* | 8/2001 | Brotto ................. | H02J 7/00047 320/106 |
| 2003/0090239 A1* | 5/2003 | Sakakibara ........... | H02J 7/0042 320/166 |
| 2004/0257043 A1 | 12/2004 | Takaoka et al. | |
| 2006/0142894 A1* | 6/2006 | Tsuchiya .............. | B23D 59/008 700/180 |
| 2007/0161404 A1* | 7/2007 | Yasujima ............. | H04W 88/06 455/557 |
| 2010/0096151 A1 | 4/2010 | Östling | |
| 2010/0117581 A1* | 5/2010 | Miwa ................... | H02P 29/032 318/472 |
| 2011/0057613 A1 | 3/2011 | Taguchi et al. | |
| 2011/0074353 A1 | 3/2011 | Miwa et al. | |
| 2011/0248576 A1* | 10/2011 | Jones ................... | H02J 7/0036 307/125 |
| 2012/0019200 A1* | 1/2012 | Abe ..................... | H01M 10/425 320/107 |
| 2012/0181984 A1 | 7/2012 | Okabayashi et al. | |
| 2014/0119575 A1* | 5/2014 | Conrad ................. | H04R 1/00 381/150 |
| 2014/0361740 A1* | 12/2014 | Suzuki ................. | H02J 7/0027 320/108 |
| 2015/0171638 A1* | 6/2015 | Huang ................. | H02J 7/0016 320/107 |
| 2015/0236523 A1* | 8/2015 | Takano ................ | H02J 7/007 320/107 |
| 2016/0013827 A1* | 1/2016 | Hubinak .............. | G06F 3/017 455/558 |
| 2016/0087314 A1* | 3/2016 | Arashima ............ | H01M 10/425 320/134 |

FOREIGN PATENT DOCUMENTS

| | | | | |
|---|---|---|---|---|
| JP | H10-174307 A | 6/1998 | | |
| JP | 2003-079067 A | 3/2003 | | |
| JP | 2003-333765 | 11/2003 | | |
| JP | 2004-048900 | 12/2004 | | |
| JP | 2010-515594 A | 5/2010 | | |
| JP | 2011-061926 A | 3/2011 | | |
| JP | 2011-072138 A | 4/2011 | | |
| JP | 2012-151934 | 9/2012 | | |
| JP | 2013-074715 | 4/2013 | | |
| WO | WO 2008/088266 A1 | 7/2008 | | |
| WO | WO 2013/014914 A2 | 1/2013 | | |
| WO | WO 2013014914 | * | 1/2013 | |
| WO | WO-2013014914 A2 | * | 1/2013 | ............. G08C 17/02 |
| WO | WO 2013/099229 A2 | 7/2013 | | |

OTHER PUBLICATIONS

Japanese Office Action corresponding to Japanese Application No. 2014-136099, dated May 15, 2018.
Japanese Office Action corresponding to Japanese Application No. 2014-136099, dated Feb. 13, 2018.
Office Action issued by JPO for corresponding Japanese patent No. 2014-136099 dated Dec. 17, 2019.
European Patent Covention corresponding application No. 15157137.9 dated Aug. 13, 2020.

* cited by examiner

POWER TOOL CHARGING DEVICE AND POWER TOOL CHARGING SYSTEM

CROSS-REFERENCE TO RELATED APPLICATIONS

This application is based upon and claims the benefit of priority from prior Japanese Patent Application No. 2014-136099, filed on Jul. 1, 2014, the entire contents of which are incorporated herein by reference.

BACKGROUND OF THE INVENTION

The present invention relates to a power tool charging device and a power tool charging system that charge a rechargeable battery for a power tool.

Power tools, such as power drivers and impact wrenches, conventionally use battery packs (rechargeable batteries) as power supply. Such a battery pack is attached in a removable manner to a power tool body. As a result, power cords, which are used to electrically connect to an external power supply, such as a commercial power supply, are removed from power tools. This eliminates inconvenience of handling power cords during operations and also allows power tools to be used at a location where no external power supply is available.

When electric power stored in such a battery pack decreases, the battery pack is set on a power tool charger. Consequently, the battery pack is charged by the power tool charger and may be used again (e.g., refer to Japanese Laid-Open Patent Publication No. 2011-72138).

SUMMARY OF THE INVENTION

A power tool charging device includes, for example, an indicator. The indicator shows information of conditions, such as completion of charging a battery pack and the state of charge of a battery. However, when a user is separated from the power tool charging device, it may be difficult to check the condition of the battery pack. Thus, there is room for improvement of the power tool charging device from the aspect of convenience.

One aspect of the present invention is a power tool charging device. The power tool charging device includes a charging unit that charges a rechargeable battery of a power tool, a condition detection unit that detects condition information of the rechargeable battery, and an information processing unit that receives the condition information of the rechargeable battery from the condition detection unit and outputs the received condition information of the rechargeable battery to a communication unit capable of performing near field communication with another device.

Another aspect of the present invention is a power tool charging system that includes a power tool charging device and a communication unit capable of performing near field communication with another device. The power tool charging device includes a charging unit that charges a rechargeable battery of a power tool, a condition detection unit that detects condition information of the rechargeable battery, and an information processing unit that receives the condition information of the rechargeable battery from the condition detection unit. The information processing unit outputs the received condition information of the rechargeable battery to the communication unit.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

One embodiment of a power tool charging system will now be described with reference to the drawings.

Figure 1:
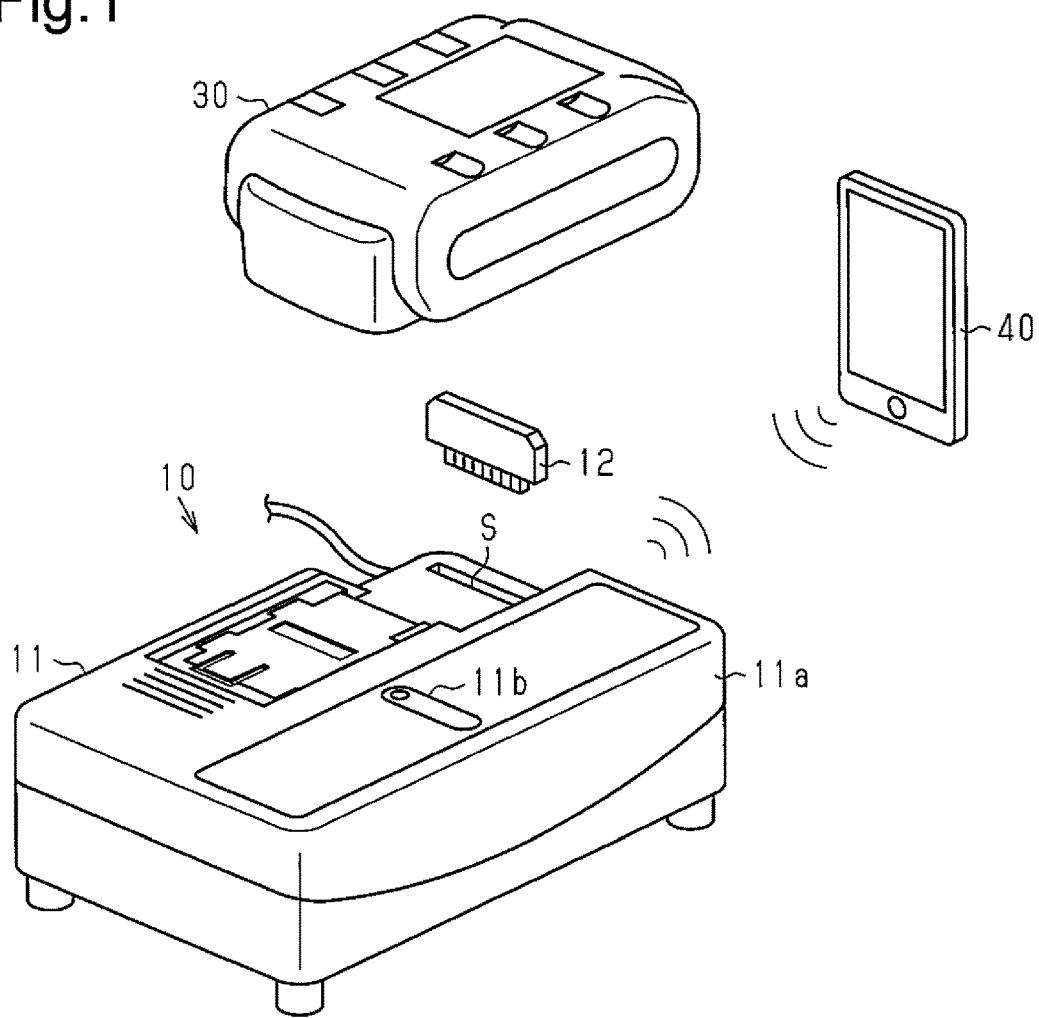
FIG. 1 is a schematic view showing the structure of one embodiment of a power tool charging device.

As shown in FIG. 1, a power tool charging system 10 of the present embodiment includes a power tool charging device (hereafter, simply referred to as the charging device) and a communication device 12. The communication device 12 corresponds to a communication unit.

The charging device 11 charges a battery pack 30. The battery pack 30 may be attached in a removable manner to a power tool (not shown).

The battery pack 30 includes at least one battery cell 31. Various types of rechargeable batteries, such as a lithium-ion battery, a nickel-metal hydride battery, and a nickel-cadmium battery, are used as the battery cell 31.

The battery pack 30 includes a positive electrode 32 arranged at the positive side of the battery cell 31 and a negative electrode 33 arranged at the negative side of the battery cell 31.

Figure 2:
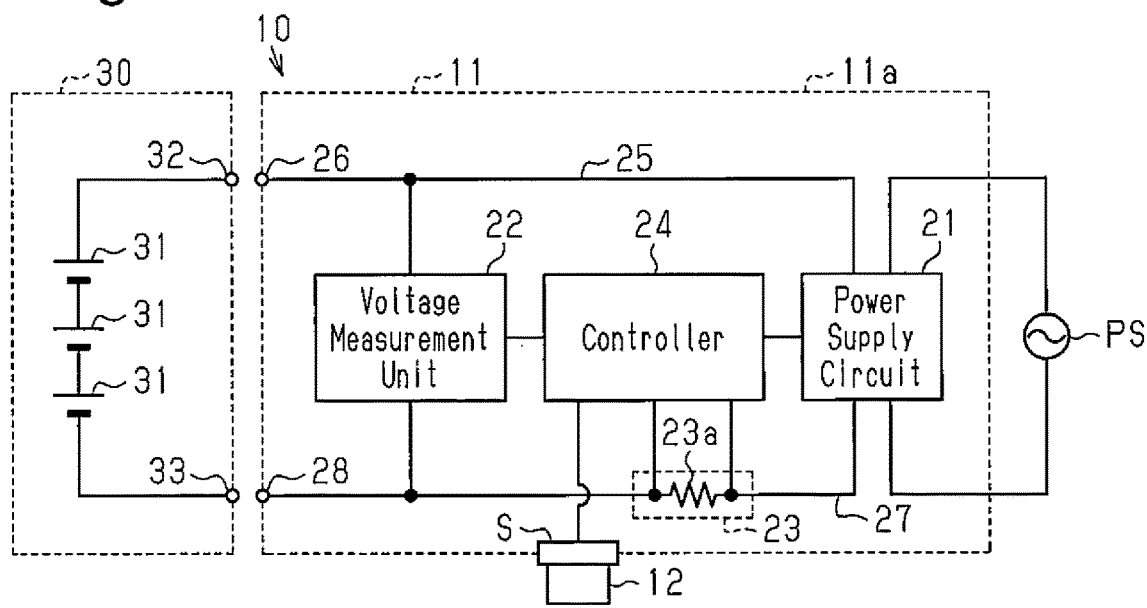
FIG. 2 is a block diagram of the power tool charging device of the embodiment.

As shown in FIG. 2, a charging device body 11a of the charging device 11 includes a power supply circuit 21 functioning as a charging unit, a voltage measurement unit 22 functioning as a condition detection unit, a current measurement unit 23, and a controller 24 functioning as an information processing unit. The charging device body 11a also includes a slot S capable of receiving the communication device 12, which performs communication with another device. The slot S corresponds to a receptacle.

The power supply circuit 21 uses a converter to convert alternating current power, which is supplied from an external alternating current power supply PS (e.g., commercial power supply), to direct current power.

The converted direct current power is supplied to the battery pack 30 through a wire in the charging device body 11a. A positive-side wire 25 of the wire is connected to a positive-side terminal 26. A negative-side wire 27 of the wire is connected to a negative-side terminal 28. The positive-side terminal 26 of the charging device body 11a is connected to the positive electrode 32 of the battery pack 30. The negative-side terminal 28 of the charging device body 11a is connected to the negative electrode 33 of the battery pack 30.

The voltage measurement unit 22 is connected between the positive-side terminal 26 and the negative-side terminal 28. The voltage measurement unit 22 measures the voltage between the two terminals 26, 28, that is, the voltage of the battery pack 30. The voltage measurement unit 22, which is connected to the controller 24, outputs a measurement result to the controller 24.

The current measurement unit 23 measures a charging current supplied to the battery pack 30. The current measurement unit 23 includes, for example, a resistor 23a arranged in the negative-side wire 27. The current measurement unit 23 derives the charging current by measuring a difference in electric potential between opposite ends of the resistor 23a.

The controller 24 controls the charging of the battery pack 30 by transmitting a control signal to the power supply circuit 21. The controller 24 also performs communication with another device via the communication device 12. Additionally, the controller 24 detects the state of charge of the battery pack 30 from the voltage of the battery pack 30 measured by the voltage measurement unit 22. When determining that the state of charge of the battery pack 30 is 100%, the controller 24 outputs the control signal to the power supply circuit 21 so that the power supply circuit 21 terminates the charging of the battery pack 30.

As shown in FIGS. 1 and 2, the slot S of the charging device body 11a is open to the exterior and configured to be capable of receiving the card-type communication device 12. The slot S is electrically connected to the controller 24. When the slot S receives the communication device 12, the controller 24 is electrically connected to the communication device 12. This allows the communication device 12 to output information to the controller 24 and the controller 24 to output information to a terminal 40 (e.g., smartphone) via the communication device 12.

The communication device 12 performs wireless communication in accordance with a near field communication standard, for example, Bluetooth (registered trademark) or ZigBee (registered trademark). The communication device 12 of the present embodiment incorporates a communication circuit in a card-type case. The communication device 12 transmits communication information including the state of charge of the battery pack 30, which serves as condition information of the battery pack 30. The communication device 12 receives, from the terminal 40, communication information including a termination signal that terminates the charging of the battery pack 30 and a starting signal that starts the charging.

The operation of the present embodiment will now be described.

In the charging system 10 of the present embodiment, when the terminals 26, 28 of the charging device body 11a are respectively connected to the electrodes 32, 33 of the battery pack 30, the controller 24 controls the power supply circuit 21 so that the charging of the battery pack 30 starts.

The controller 24 also detects the state of charge of the battery pack 30 in accordance with the voltage measured by the voltage measurement unit 22. The voltage measurement unit 22 measures the voltage of the battery pack 30 regardless of whether or not the battery pack 30 is being charged. The controller 24 detects the state of charge of the battery pack 30 in accordance with the measured voltage of the battery pack 30.

The controller 24 of the charging device 11 outputs the condition information of the battery pack 30 to another device when the slot S of the charging device body 11a receives the communication device 12. The condition information of the battery pack 30 includes, for example, the state of charge of the battery pack 30. When receiving the condition information of the battery pack 30, the terminal 40 shows the received condition information of the battery pack 30 on a display. This allows a user carrying the terminal 40 to check the condition information of the battery pack 30 even when the terminal 40 is separated from the battery pack 30 and the charging device 11 as long as the terminal 40 is within an area in which the charging device 11 can perform communication.

When receiving the termination signal from the terminal 40 via the communication device 12, the controller 24 outputs the control signal to the power supply circuit 21 so that the charging of the battery pack 30 is terminated.

The present embodiment has the advantages described below.

(1) The controller 24, which functions as the information processing unit, is capable of outputting the condition information of the battery pack 30 via the external communication device 12. Thus, when the terminal 40 (e.g., smartphone) is within the area in which the communication device 12 can perform communication, the terminal 40 may receive condition information of the battery pack 30 and show the condition information of the battery pack 30 on the display. This allows the user to check the condition information of the battery pack 30 using the terminal 40 even when the user is separated from the battery pack 30 and the charging device 11. Consequently, convenience of the charging device 11 may be improved.

(2) The voltage measurement unit 22, which functions as the condition detection unit, and the controller 24 detect the condition of the battery pack 30 regardless of whether or not the power supply circuit 21, which forms the charging unit, is charging the battery pack 30. The communication device 12 is configured to be capable of outputting the condition information of the battery pack 30 to another device. Thus, the condition (state of charge) information of the battery pack 30 may be shown on the display of the terminal 40 even when, for example, the battery pack 30 is not charged. This further improves convenience of the charging device 11.

(3) The charging device body 11a includes the slot S capable of receiving the communication device 12 in a removable manner. Thus, the communication device 12 may be installed independently, which allows the power tool charging device to perform communication with another device. In particular, use of a versatile communication standard, such as Bluetooth (registered trademark) or ZigBee (registered trademark), allows the communication device 12 to be applied to another power tool charging device (charging device body).

(4) The controller 24, which forms the charging unit, and the power supply circuit 21 terminate the charging of the battery pack 30 when receiving a charging termination signal via the communication device 12. Thus, the charging device 11 may be controlled so that the charging is terminated using the terminal 40.

(5) The power tool charging system includes the power tool charging device 11 and the communication device 12. This ensures communication with another device.

It should be apparent to those skilled in the art that the present invention may be embodied in many other specific forms without departing from the scope of the invention. Particularly, it should be understood that the present invention may be embodied in the following forms.

The above embodiment employs a process for detecting the state of charge of the battery pack 30 based on the voltage between the terminals of the battery pack 30. However, there is no limit to such a configuration. Any process may be employed as long as the state of charge of the battery pack 30 can be detected. For example, the state of charge of the battery pack 30 may be detected from the voltage between the terminals (output voltage) corresponding to the output current of the battery pack 30.

The above embodiment includes a configuration that detects the state of charge as the condition information of the battery pack 30. However, there is no limit to such a configuration. The condition information of the battery pack 30 may include any information that a user wants. Examples are described below.

(A) Usage history of the battery pack 30
(B) Whether or not the battery pack 30 is being charged
(C) Remaining charging time when the battery pack 30 is being charged.
(D) Voltage of the battery pack 30
(E) Whether or not the charging of the battery pack 30 is completed
(F) Part number of the battery pack 30
(G) Manufacturing number of the battery pack 30
(H) Temperature of the battery pack 30

Although not particularly referred in the embodiment, the charging device body 11a may include an indicator 11b, as shown in FIG. 1, which shows the amount of power left in a battery and the state of charge of the battery.

The embodiment employs a smartphone as the terminal 40. However, a tablet-type terminal, a note-type terminal (note PC), a dedicated terminal, and the like may be employed.

The embodiments and the modified examples may be combined.

The present disclosure includes the embodiments described below.

Embodiment 1

A power tool charging device includes a charging unit that charges a rechargeable battery of a power tool, a condition detection unit that detects condition information of the rechargeable battery, and an information processing unit that receives the condition information of the rechargeable battery from the condition detection unit and outputs the received condition information of the rechargeable battery to a communication unit capable of performing near field communication with another device.

Embodiment 2

In the power tool charging device according to embodiment 1, the condition detection unit detects the condition information of the rechargeable battery regardless of whether or not the charging unit is charging the rechargeable battery. The information processing unit outputs the condition information of the rechargeable battery detected by the condition detection unit to the communication unit.

Embodiment 3

The power tool charging device according to embodiment 1, further includes a charging device body that accommodates the charging unit, the condition detection unit, and the information processing unit. The charging device body includes a receptacle that receives the communication unit in a removable manner.

Embodiment 4

In the power tool charging device according to embodiment 1, when receiving a charging termination signal from another device via the communication unit, the information processing unit has the charging unit terminate charging of the rechargeable battery.

Embodiment 5

A power tool charging system includes a power tool charging device and a communication unit capable of performing near field communication with another device. The power tool charging device includes a charging unit that charges a rechargeable battery of a power tool, a condition detection unit that detects condition information of the rechargeable battery, and an information processing unit that receives the condition information of the rechargeable battery from the condition detection unit. The information processing unit outputs the received condition information of the rechargeable battery to the communication unit.

The present examples and embodiments are to be considered as illustrative and not restrictive, and the invention is not to be limited to the details given herein, but may be modified within the scope and equivalence of the appended claims.

The invention claimed is:

1. A power tool charging system comprising:
   a battery pack of a power tool;
   a power tool charger that charges a battery pack of a power tool, wherein the power tool charger includes
      a charging unit that supplies direct current power to at least one battery cell of the battery pack for charging a rechargeable battery of a power tool,
      a condition detection unit that measures the voltage of the battery pack to detect condition information of the battery pack when the battery pack is being charged, and
      an information processing unit that receives the condition information of the battery pack from the condition detection unit; and
   a communication unit that is configured to perform wireless communication with another device in accordance with a near field communication standard when the battery pack is being charged,
   wherein the information processing unit outputs the received condition information of the battery pack to the communication unit,
   the power tool charger further including a charger body that accommodates the charging unit, the condition detection unit, and the information processing unit,
   the charger body includes:
   a plurality of terminals of the-charger body that are respectively connectable to a plurality of electrodes of the battery pack,
   wherein the condition information includes state of charge of the battery pack and remaining charging time when the battery pack is being charged,
   wherein the power tool charging system further comprises the another device that is a smartphone,
   the communication unit is a card type communication device,
   wherein the charger body includes:
      an upper surface on which the battery pack can be mounted; and
      a cutout that is formed in a part of the upper surface of the charger body to form a higher surface and a lower surface of the upper surface,
      the lower surface of the upper surface includes a slot that is open to the exterior and configured to be capable of receiving the card type communication device,
      when the battery pack is mounted on the upper surface, the battery pack covers at least part of the cutout.

2. The power tool charger according to claim 1, wherein the battery pack remains external to the charger when the battery pack is connected to the charger.

3. The power tool charger according to claim 1, wherein the plurality of terminals of the charger body is at least partially arranged on an outer surface of the charger body.

4. The power tool charging system according to claim 1, wherein when receiving a charging termination signal from another device via the communication unit, the information processing unit has the charging unit terminate charging of the rechargeable battery.

5. The power tool charging system according to claim 1, wherein the battery pack remains external to the charger when the battery pack is connected to the charger.

6. The power tool charging system according to claim 5, wherein the plurality of terminals of the charger body is at least partially arranged on an outer surface of the charger body.

7. A power tool charger that charges a battery pack of a power tool comprising:
   a charging unit that supplies direct current power to at least one battery cell of the battery pack for charging a rechargeable battery of a power tool;
   a condition detection unit that measures the voltage of the battery pack to detect condition information of the battery pack when the battery pack is being charged; and
   an information processing unit that receives the condition information of the battery pack from the condition detection unit and outputs the received condition information of the battery pack to a communication unit that is configured to perform wireless communication with another device in accordance with a near field communication standard when the battery pack is being charged,
   further comprising a charger body that accommodates the charging unit, the condition detection unit, and the information processing unit,
   the charger body includes:
   a plurality of terminals of the charger body that are respectively connectable to a plurality of electrodes of the battery pack,
   wherein the condition information includes the state of charge of the battery pack and the remaining charging time when the battery pack is being charged,
   wherein the another device is a smartphone,
   wherein the communication unit is a card type communication device,
   the charger body includes:
      an upper surface on which the battery pack can be mounted; and
      a cutout that is formed in a part of the upper surface of the charger body to form a higher surface and a lower surface of the upper surface,
      the lower surface of the upper surface includes a slot that is open to the exterior and configured to be capable of receiving the card type communication device,
      when the battery pack is mounted on the upper surface, the battery pack covers at least part of the cutout.

* * * * *